United States Patent [19]
Oku et al.

[11] Patent Number: 5,726,468
[45] Date of Patent: Mar. 10, 1998

[54] COMPOUND SEMICONDUCTOR BIPOLAR TRANSISTOR

[75] Inventors: Tomoki Oku; Hirofumi Nakano; Shinichi Miyakuni; Teruyuki Shimura; Ryo Hattori, all of Tokyo, Japan

[73] Assignee: Mitsubishi Denki Kabushiki Kaisha, Tokyo, Japan

[21] Appl. No.: 614,688

[22] Filed: Mar. 13, 1996

[30] Foreign Application Priority Data

Oct. 13, 1995 [JP] Japan .................. 7-265717

[51] Int. Cl.⁶ .................. H01L 31/0328; H01L 31/0336
[52] U.S. Cl. .......................... 257/197; 257/198
[58] Field of Search .................. 257/197, 198, 257/587, 588, 744, 745

[56] References Cited

U.S. PATENT DOCUMENTS 5,336,909  8/1994  Katoh et al. ............... 257/197
5,512,785  4/1996  Haver et al. ................ 27/587

OTHER PUBLICATIONS

Marusen, "Silicon Based Hetero Devices", Chapter II. Recent Development of GaAs Based HBT, 1991, pp. 295-299.

Hayama et al., "Emmitter Size Effect On Current Gain In Fully Self-Aligned AlGaAs/GaAs HBT's With AlGaAs Surface Passivation Layer", IEEE Electron Device Letters, vol. 11, No. 9, 1990, pp. 388-390.

*Primary Examiner*—Wael Fahmy
*Attorney, Agent, or Firm*—Leydig, Voit & Mayer, Ltd.

[57] ABSTRACT

A semiconductor device includes a semiconductor substrate; a first active layer disposed on the semiconductor substrate; a second active layer disposed on the first active layer; a first electrode including a lower stage disposed on the second active layer and an upper stage disposed on the lower stage and having an overhanging portion protruding from the lower stage; an insulating film continuously covering a surface of the second active layer, a side surface of the lower stage of the first electrode, and a lower surface and a side surface of the overhanging portion of the upper stage; and a second electrode disposed on the surface of the first active layer at opposite sides of the second active layer, self-aligned with the second active layer. The distance between the second electrode and the second active layer is minimized and the thickness of the second electrode can be about 7000 Å, minimizing the resistance of the first active layer and improving high frequency characteristics. Electrical separation between the first and second active layers can be achieved reliably. Recombination at the surface of the second active layer is suppressed.

5 Claims, 15 Drawing Sheets

COMPOUND SEMICONDUCTOR BIPOLAR TRANSISTOR

FIELD OF THE INVENTION

The present invention relates to a semiconductor device, such as a heterojunction bipolar transistor or the like, and a method of fabricating the semiconductor device.

BACKGROUND OF THE INVENTION

A heterojunction bipolar transistor (hereinafter referred to as HBT) is a device which can most effectively utilize the electron transport characteristics of III–V semiconductor materials for realizing high speed devices. Steady progress in the development of epitaxial techniques and applications to the fields of super high speed digital circuits, microwave integrated circuits, millimeter wave integrated circuits, power elements, and the like has been made. Since an HBT employs multiple epitaxial layers that can form a high carrier concentration, thin base layer, however, use of planar structures used in silicon devices is difficult and a so-called mesa type transistor structure has to be employed. In order to improve the characteristics of the mesa type transistor, not only an improvement in the epitaxial structure but a reduction in parasitic resistance and parasitic capacitance due to self-alignment has to be attempted. In order to realize these improvements, research and development of self-aligned HBTs have been extensively carried out. FIG. 10 is a cross-sectional view illustrating a prior art HBT disclosed by N. Hayama and K. Honjo, *IEEE Electron Device Letters*, Volume 11 (1990) page 388. FIGS. 11(a)–11(i) are cross-sectional views illustrating a method of fabricating the HBT. In FIGS. 11(a)–11(i), reference numeral 201 designates a compound semiconductor substrate, numeral 202 designates a base layer, numeral 203 designates an emitter layer, numeral 204 designates an SiN layer, numeral 205 designates an SiO$_2$ layer, numeral 206 designates a base electrode, numeral 207 designates an SiO$_2$ layer, and numeral 208 designates an emitter electrode. In FIGS. 11(a)–11(i), the collector layer shown in FIG. 10 is included in the compound semiconductor substrate 201.

A description is given of the method of fabricating the HBT. Initially, a base layer 202 and an emitter layer 203 are epitaxially grown on a compound semiconductor substrate 201 and, thereafter, an SiN film 204 is deposited on the entire surface of the epitaxial layer. Then, using photolithography, the SiN layer 204 is etched to leave a portion only on the region where the emitter layer is to be formed, as shown in FIG. 11(a). Next, by dry etching with Cl$_2$ gas to an intermediate position of the emitter layer 203, using the SiN film 204 as a mask, a mesa structure serving as an emitter layer is formed as shown in FIG. 11(b). An SiO$_2$ film 205 is deposited on the entire surface of the substrate and etched back to the SiO$_2$ film 205, thereby leaving the first side wall SiO$_2$ film 205 on both sides of the mesa structure. Further, portions of the emitter layer 203 remaining outside the first side wall SiO$_2$ films 205 are wet etched so that the upper layer of the base 202 is exposed as shown in FIG. 11(c). In the step of FIG. 11(d), AuMn serving as the base electrode 206 is deposited by evaporation. In the step of FIG. 11(e), portions of the base electrode 206 on the side surfaces of the side wall SiO$_2$ films 205 are etched and removed by ion milling in a diagonal direction. In the step of FIG. 11(f), the second side wall SiO$_2$ film 207 is formed. The method of forming the second side wall SiO$_2$ film 207 is the same as that for forming the first side wall SiO$_2$ film 205. In other words, an SiO$_2$ film is deposited on the entire surface of the substrate and then etched back. In the step of FIG. 11(g), the base electrode 206a is etched and removed by ion milling. In the step of FIG. 11(h), the SiN film 204 is removed selectively with respect to the first side wall SiO$_2$ film 205 and the second side wall SiO$_2$ film 207. The selective removal of the SiN film 204 can be easily achieved by plasma etching using SF$_6$ or the like. Finally, in the step of FIG. 11(i), the emitter electrode 208 is formed, whereby the structure shown in FIG. 10 is completed. In this way, an HBT is formed in a self-aligned process.

In the fabricating method described above, however, during the separation of the base electrode material 206 shown in FIG. 11(e), since diagonal direction ion milling has to be used, etching residue is left or excessive etching occurs.

FIGS. 12(a)–12(k) are cross-sectional views illustrating process steps in a prior art method of fabricating an HBT disclosed in Japanese Published Patent Application Hei. 6-154717. In FIGS. 12(a)–12(k), the same reference numerals as in FIGS. 11(a)–11(i) designate the same or corresponding parts. Reference numerals 209 and 215 designate insulating films. Numerals 210, 211, 213, and 214 designate resist, and numeral 212 designates an emitter electrode comprising a refractory metal.

A description is given of this method of fabricating the semiconductor device. Initially, in the step of FIG. 12(a), the base layer 202 and the emitter layer 203 are formed on the compound semiconductor substrate 201 by epitaxial growth. Thereafter, the insulating film 209 is deposited on the entire surface of the epitaxial layer and a resist 210 having an aperture is formed on the insulating film 209. In the step of FIG. 12(b), the insulating film 209 is taper etched by reactive ion etching (hereinafter referred to as RIE) using the resist 210 as a mask. After removing the resist 210, the refractory metal film 212 is deposited on the entire surface by sputtering and, thereafter, in the step of FIG. 12(c), resist 211 is deposited in the concave part of the refractory metal film 212. In the step of FIG. 12(d), after the refractory metal film 212 is etched using the resist 211 as a mask, the resist 211 is removed.

In the step of FIG. 12(e), the emitter layer 203 is etched to an intermediate position, thereby forming a mesa structure as an emitter region. In the step of FIG. 12(f), the resists 213 are buried. In the step of FIG. 12(g), the insulating film 209 is etched and removed. In the step of FIG. 12(h), the emitter layer 203 is etched until the base layer 202 is exposed. In the step of FIG. 12(i), the base electrode 206 is deposited by evaporation. After UV (ultraviolet) reforming of the resist 213, the base electrode pattern is formed by the resist 214 so that the base electrode can be lifted-off prior to the deposition of the base electrode metal. In the step of FIG. 12(j), the base electrodes 206 are formed. In the step of FIG. 12(k), the insulating film 215 for passivation is deposited. Though not shown in the figure, the resist is patterned by photolithography and, using the patterned resist as a mask, the insulating film 215 and the base layer 202 are etched, thereby forming the collector electrode, completing an HBT.

In the fabricating method shown in FIGS. 12(a)–12(k), there is no necessity of employing diagonal ion milling as in the fabricating method shown in FIGS. 11(a)–11(i), whereby deterioration of the device characteristics is suppressed. In addition, the mesa structure of the emitter region can be formed self-aligningly with the refractory metal electrode serving as an emitter electrode, whereby variation in device characteristics is suppressed.

FIGS. 13(a)–13(c) are cross-sectional views illustrating process steps in the prior art method of fabricating an HBT disclosed in Chapter 11, "Recent Development of GaAs Based HBT of Silicon Based Hetero Devices", (Maruzen, 1991). In FIGS. 13(a)–13(c), reference numeral 101 designates a compound semiconductor substrate, numeral 102 designates a collector layer, numeral 103 designates a base layer, numeral 104 designates an emitter layer, numeral 105 designates a refractory metal emitter electrode, numeral 106 designates a resist, numeral 107 designates a base electrode, and numeral 107a designates a base electrode metal.

A description is given of the fabricating method. Initially, in the step of FIG. 13(a), an HBT epitaxial substrate comprising a compound semiconductor substrate 101, a collector layer 102, a base layer 103, and an emitter layer 104 about 3000 Å (0.3 μm) thick is prepared, and a refractory metal layer 105 about 3000 Å thick is formed on the substrate. A resist 106 is patterned on the refractory metal layer and, thereafter, the refractory metal layer 105 is etched using the resist 106 as a mask. During the etching of the refractory metal emitter electrode 105, in order to make the processing dimension of the refractory metal emitter electrode 105 smaller than the resist 106, RIE or ECR (electron cyclotron resonance) etching using a gas mixture, such as $CF_4+O_2$ or $SF_6+CHF_3$, is employed. Usually, the width of the resist 106 is about 2-3 μm, and it is only reduced by about 0.1–0.2 μm by processing. After the resist 106 is removed by $O_2$ ashing, an organic solvent, or the like, in the step of FIG. 13(b), the emitter layer 104 is etched using the refractory metal emitter electrode 105 as a mask until the base layer 103 is exposed. Wet etching is used and the emitter layer 104 remains below the refractory metal emitter electrode 105. In this wet etching, a mixture of tartaric acid and hydrogen peroxide is employed as the etchant. The etching is isotropic and the side etching amounts to about 3000 Å, which is approximately equal to the thickness of the emitter layer 4. Finally, the base electrode pattern is formed with the resist and, thereafter, the base electrode metal 107a is deposited on the entire surface and is lifted-off, whereby the base electrode 107 is formed, completing the HBT shown in FIG. 13(c). Then, the distance from the emitter layer 104 to the base electrode 107 on the base layer 103 is about 0.3 μm, which is approximately equal to the thickness of the emitter layer 104.

Since, in the fabricating method shown in FIGS. 13(a)–13(c), the distance from the emitter layer 104 to the base electrode 107 on the base layer 103 is determined self-aligningly, the controllability of the distance is superior and the yield of the product can be improved. In addition, because the distance between the emitter layer 104 and the base electrode 107 is short, the base resistance can be suppressed. In this fabricating method, however, the thickness of the base electrode 107 cannot be larger than the thickness of the emitter layer 104 and is restricted to about 2000 Å as the maximum thickness at which no short-circuiting arises between the base and the emitter.

FIGS. 14(a)–14(e) are cross-sectional views illustrating another prior art method of fabricating a semiconductor device. In FIGS. 14(a)–14(e), the same reference numerals as in FIGS. 13(a)–13(c) designate the same or corresponding parts. Reference numeral 105a designates a first refractory metal emitter electrode, numeral 105b designates a second refractory metal electrode, and numeral 108 designates a side wall insulating film.

Initially, an HBT epitaxial substrate comprising a compound semiconductor substrate 101, a collector layer 102, a base layer 103, and an emitter layer 104 about 3000 Å (0.3 μm) thick is prepared. A first refractory metal emitter electrode 105a about 5000 Å (0.5 μm) thick and a second refractory metal electrode 105b about 1000 Å (0.1 μm) thick are successively formed on the substrate, and resist 106 is formed and patterned on the second refractory metal emitter electrode 105b. Thereafter, in the step of FIG. 14(a), the first refractory metal electrode 105a and the second refractory metal electrode 105b are etched using the resist 106 as a mask. In the step of FIG. 14(b), the first refractory metal emitter electrode 105a is etched using the resist 106 and the second refractory metal emitter electrode 105b as a mask, with side etching of about 0.2 μm, resulting in the first refractory metal emitter electrode 105a having a width smaller than the width of the second refractory metal emitter electrode 105b. For the etching of the first refractory metal emitter electrode 105a, RIE or ECR etching using a gas such as $CF_4+O_2$ or $SF_6+CHF_3$ is employed.

In the step of FIG. 14(c), using the resist 106, the second refractory metal emitter electrode 105b, and the first refractory metal electrode 105a as a mask, and a mixture of tartaric acid and hydrogen peroxide, the emitter layer 104 is etched so that the thickness of the emitter layer 104, other than the connecting portion of the emitter layer 104 and the first refractory metal emitter electrode 105a, becomes smaller and side etching occurs below the first refractory metal emitter electrode 105. By using isotropic wet etching, the side etching is about 0.3 μm (3000 Å), which is about the thickness of the emitter layer 104. After removing the resist 106, the side wall insulating film 108 is deposited on the entire surface and etched back so that the side wall insulating films 108 remain continuous over a portion of the surface of the emitter layer 104, the side surface of the first refractory metal emitter electrode 105a, and the lower surface and the side surface of the overhanging portion of the second refractory metal emitter electrode 105b protruding from the first refractory metal emitter electrode 105a. In addition, the emitter layer 104 is etched using the side wall insulating film 108 and the refractory metal emitter electrode 105 as a mask. In the step of FIG. 14(d), the emitter layer 104, other than the mask, is removed and the base layer 103 is exposed. Finally, a base electrode pattern is formed by resist, the base electrode metal 107a is deposited on the entire surface, and the resist is lifted off to form the base electrode 107, thereby completing the HBT as shown in FIG. 14(e). In other words, the base electrode 107 is formed self-aligningly with the emitter layer 104. The thickness of the base electrode 107 can be the sum of the thicknesses of the emitter layer 104 and the first refractory metal emitter electrode 105a, so no short-circuiting between the base and emitter occurs and a base electrode about 7000 Å thick is formed.

In the fabricating method shown in FIGS. 14(a)–14(e), the thickness of the base electrode can be increased, so the base resistance can be suppressed. In addition, since the base electrode is not exposed directly at a surface, surface recombination can be suppressed.

In this fabricating method, the base electrode 107 is formed at a position more than 0.5 μm from the emitter layer 104, as shown in FIG. 14(e). Because of side etching of about 0.2 μm, the first refractory metal electrode 105a has the step shown in FIG. 14(b). Side etching of about 0.3 μm in the emitter layer 104 in the step of FIG. 14(c) results in total side etching of more than 0.5 μm.

Accordingly, in this fabricating method, even if the thickness of the base electrode 107 is large, the distance between the emitter layer 104 and the base electrode 107 is lengthened, increasing the base resistance, resulting in no improvement in high frequency characteristics. In addition, although this semiconductor device includes the side etched portion and the side wall insulating film 108 on the side etched portion, in the structure obtained by the prior art fabricating method, it is difficult to completely electrically separate the emitter electrode 105 from the base electrode 107.

FIGS. 15(a)–15(b) are cross-sectional views illustrating a prior art HBT in which the base electrode 107 is thin on the side wall insulating film 108. In FIGS. 15(a)–(b), the same reference numerals as in FIGS. 13(a)–13(c) and 14(a)–14(e) designate the same or corresponding parts. The emitter layer 104 formed by etching has a reverse mesa or a forward mesa shape.

When the emitter layer 104 has the reverse mesa structure as shown in FIG. 15(a), the base electrode 107 is cut at a position directly under the side surface of the outermost portion of the side wall insulating film 108 and is not connected to the side surface of the side wall insulating film 108 on the side surface of the second refractory metal emitter electrode 105a. On the other hand, when the emitter layer 104 has a forward mesa structure as shown in FIG. 15(b), the base electrode 107 is connected to the side surface of the side wall insulating film 108 on the side surface of the second refractory metal emitter electrode 105a. This is because, when the emitter layer has a forward mesa direction, the emitter layer 104 and the side wall insulating film 108 have configurations providing good coverage by the base electrode material. Thus, the prior art semiconductor device has difficulty in that the emitter electrode 105 and the base electrode 107 are not completely electrically separated.

In the fabricating method shown in FIGS. 11(a)–11(i), it is necessary to separate the base electrode material 206a deposited on the emitter electrode from the base electrode material 206b deposited on the base layer by diagonal ion milling in the step of FIG. 11(e). However, this separation is difficult to perform reliably and etching residue or excessive etching arises in that separating process, resulting in deterioration of device characteristics or an increase in variations in device characteristics.

In the prior art fabricating method shown in FIGS. 12(a)–12(k), since the compound semiconductor layer (emitter layer) is dry etched in the step of FIG. 12(e), an increase in cost is unavoidable. Further, the fabricating process is unstable, resulting in a reduction in yield.

In the prior art fabricating method shown in FIGS. 13(a)–13(c), the thickness of the base electrode 107 cannot be larger than the thickness of the emitter layer 104 and is restricted to, as a maximum, about 2000 Å to avoid short-circuiting between the base and emitter. Therefore, even if the distance between the emitter layer and the base electrode can be minimized, an increase in the base resistance that is detrimental to improvement in the high frequency characteristics may occur. In addition, since the surface of the base layer 103 between the emitter layer 104 and the base electrode 107 is exposed, surface recombination of carriers occurs, resulting in deterioration of the amplification factor.

In the prior art fabricating method shown in FIGS. 14(a)–14(e), although the base electrode 107 can be thicker, the distance between the emitter layer 104 and the base electrode 107 is larger, increasing the base resistance, limiting the improvement in the high frequency characteristics. In addition, the emitter electrode 105 and the base electrode 107 cannot be completely electrically separated.

SUMMARY OF THE INVENTION

It is an object of the present invention to provide a semiconductor device with improved high frequency characteristics having reduced base resistance due to a minimized distance between the emitter electrode and the base electrode and an increased thickness of the base electrode.

It is another object of the present invention to provide a semiconductor device that can completely electrically separate the emitter electrode and the base electrode.

It is a further object of the present invention to provide a method of fabricating a semiconductor device that can prevent deterioration and variations in device characteristics and reduce fabrication cost.

Other objects and advantages of the present invention will become apparent from the detailed description given hereinafter; it should be understood, however, that the detailed description and specific embodiments are given by way of illustration only, since various changes and modifications within the scope of the invention will become apparent to those skilled in the art from this detailed description.

According to a first aspect of the present invention, a semiconductor device comprises a semiconductor substrate; a first active layer disposed on the semiconductor substrate; a second active layer disposed on the first active layer and patterned into a prescribed configuration; a first electrode comprising a lower stage disposed on the second active layer and having a width narrowed in the vicinity of the contact with the second active layer, and an upper stage disposed on the lower stage and having an overhanging portion protruding from the lower stage; an insulating film continuously covering the second active layer, a side surface of the lower stage of the first electrode, and a lower surface and a side surface of the overhanging portion of the upper stage; and a second electrode disposed on the first active layer at both sides of the second active layer, self-aligned with the second active layer. The distance between the base electrode and the emitter layer of the HBT can be minimized to about 0.3 μm, and, simultaneously, the thickness of the base electrode can be thick, about 7000 Å, whereby the base resistance is minimized and the high frequency characteristics are improved. In addition, since the first refractory metal emitter electrode has a width narrowed in the vicinity of the contact with the emitter layer, electrical separation between the emitter and base is assured. In addition, because the base layer is not exposed at a surface of the element, recombination at the surface of the base layer is suppressed.

According to a second aspect of the present invention, the semiconductor device is a heterojunction bipolar transistor including a base layer comprising the first active layer, an emitter layer comprising the second active layer, and a collector layer comprising the semiconductor layer disposed between the first active layer and the semiconductor layer.

According to a third aspect of the present invention, in the semiconductor device, the lower stage of the first electrode and the upper stage of the first electrode comprise metals having different etching selectivities.

According to a fourth aspect of the present invention, in the semiconductor device, the lower stage of the first electrode comprises WSi and the upper stage of the first electrode comprises W.

According to a fifth aspect of the present invention, a method of fabricating a semiconductor device comprises forming, successively laminated, a first active layer, a second active layer, and first and second metal layers having different etching selectivities as a first electrode on a main surface of a semiconductor substrate; forming a resist pattern on the second metal layer and just-etching the second and the first metal layers using the resist pattern as a mask; etching the second active layer using the just-etched metal layer as a mask so that the thickness of the second active layer is smaller in a region where the metal layer is not disposed and the width of the contact of the second active layer with the first metal layer is smaller in a region where the metal layer is present; selectively side-etching the first metal layer so that the width of the first metal layer is smaller than the width of the second metal layer and the width of the first metal layer is still smaller in the vicinity of the contact with the second active; after the removal of the resist, depositing an insulating film on the entire surface; etching back the insulating film to leave a continuous insulating film on a part of the surface of the second active layer, the side surface of the first metal layer, and the lower surface and the side surface of the overhanging portion of the second metal layer protruding from the first metal layer; etching the second active layer so that the second active layer, other than the mask portion, is removed and the second active layer below the mask is side etched using the insulating film and the metal layer as a mask; depositing a metal layer on the first active layer as a second electrode exposed at both sides of the first electrode, the upper surface of the second metal layer, and the insulating film at the side surface of the overhanging portion of the second metal layer. Since diagonal ion milling is not required, deterioration of the device characteristics and variations in the device characteristics can be suppressed. In addition, since no dry etching of the compound semiconductor layers is required, the process cost is reduced.

According to a sixth aspect of the present invention, in the fabrication method, the first metal layer comprises W and the second metal layer comprises WSi, and the first metal layer is selectively side etched by RIE or ECR etching using $CF_4+O_2$ or $SF_6+CHF_3$.

According to a seventh aspect of the present invention, a method of fabricating a semiconductor device comprises forming, successively laminated, a first active layer, a second active layer, first and second metal layers having different etching selectivities and serving as a first electrode, and an insulating film on a main surface of a semiconductor substrate; forming a resist pattern on the insulating film at a first semiconductor element formation region, and just-etching the insulating film and the second and first metal layers using the resist pattern as a mask; after removal of the resist, forming a second semiconductor element on the second active layer; after covering the second semiconductor element with the resist, etching the second active layer using the just-etched metal layer and the resist covering the second semiconductor element as a mask so that the active layer becomes thinner at a region where the metal layer is not present and at a region where the resist covering the semiconductor element is not present so that the width of the second active layer at the contact with the first metal layer is smaller than the width of the metal layer at a region where the metal layer is present; selectively side-etching the first metal layer so that the width of the first metal layer is smaller than the width of the second metal layer and the width of the first metal layer is still smaller in the vicinity of the contact with the second active layer; after removal of the resist covering the insulating film and the second semiconductor element, depositing an insulating film on the substrate; etching back the insulating film to leave a continuous insulating film on a portion of the surface of the second active layer, the side surface of the first metal layer, and the lower surface and the side surface of the overhanging portion of the second metal film protruding from the first metal film; after covering the second semiconductor element with resist, etching the second active layer using the continuous insulating film, the metal layer, and the resist covering the second semiconductor element as a mask, so that the second active layer, other than the mask, is removed and the second active layer under the mask is side-etched; and forming a resist on the second semiconductor device and the surface of the first active layer, depositing a second electrode material on the entire surface, and lifting off to form a second electrode self-aligningly. While the semiconductor element is formed on the same substrate on which other semiconductor elements such as resistors are formed, the semiconductor element is formed while protecting the other semiconductor elements with resists, whereby a semiconductor device including a plurality of semiconductor elements can be easily fabricated without damaging the other semiconductor elements.

DETAILED DESCRIPTION OF THE PREFERRED EMBODIMENTS

Embodiment 1

Figure 1:
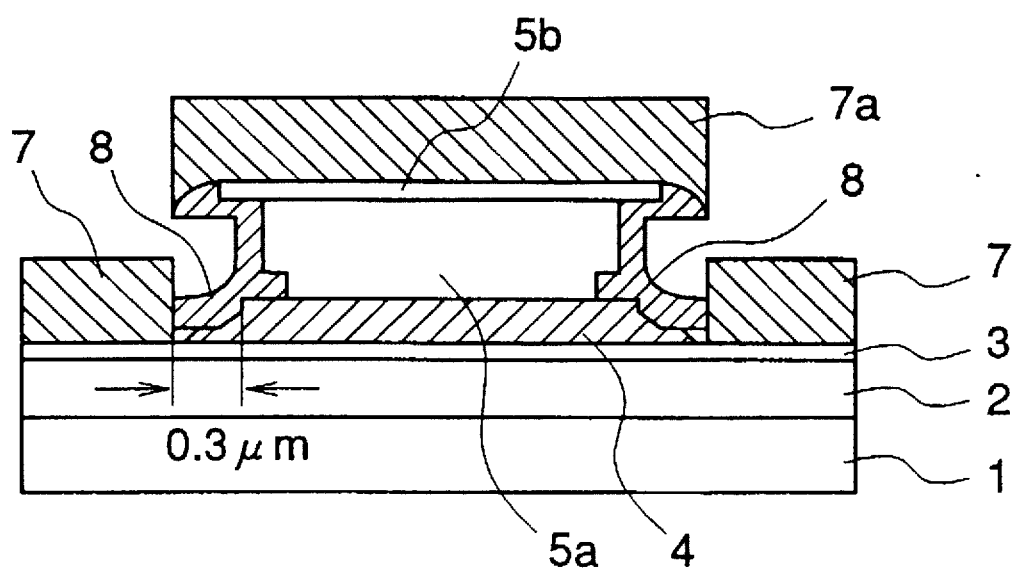
FIG. 1 is a cross-sectional view illustrating a semiconductor device according to a first embodiment of the present invention.

A semiconductor device according a first embodiment of the present invention comprises, as shown in FIG. 1, a semiconductor substrate (compound semiconductor substrate 1), a first active layer (base layer 3) disposed on the semiconductor substrate 1, a second active layer (emitter layer 4) disposed on the first active layer 3 and patterned in a prescribed configuration, a first electrode (refractory metal emitter electrode) comprising a lower stage (first refractory metal emitter electrode 5a) disposed on the second active layer 4 and having a width narrowing in the vicinity of the contact with the second active layer 4 and an upper stage (second refractory metal emitter electrode 5b) disposed on the lower stage 5a having an overhanging portion protruding from the lower stage 5a, an insulating film (side wall insulating film 8) continuously covering the surface of the second active layer 4, the side surface of the lower stage 5a of the first electrode, and the lower surface and the side surface of the overhanging portion of the upper stage 5b, and a second electrode (base electrode 7) disposed on the surface of the first active layer 3 on opposite sides of the second active layer 4, self-aligned with the second active layer 4. Therefore, the base resistance can be reduced and the electrical separation of the emitter and base is established reliably.

More particularly, as shown in FIG. 1, on the compound semiconductor layer 1 including semiconductor layers such as the base layer 3 and the collector layer 2, an emitter layer 4 is disposed and has a thickness of about 3000 Å. On the emitter layer 4, the first refractory metal emitter electrode 5a, undercut at both sides of the connecting portion by the emitter layer 4, has a thickness of about 5000 Å and, on the first refractory metal emitter electrode 5a, the second refractory metal emitter electrode 5b has a thickness of 1000 Å. Since the first refractory metal emitter electrode 5a is narrower than the second refractory metal emitter electrode 5b, the second refractory metal emitter electrode 5b includes an overhanging portion protruding from the first refractory metal emitter electrode 5a. Insulating films 8 are disposed on the side surfaces of the emitter layer 4 and the first refractory metal emitter electrode 5a and the lower surface and the side surface of the overhanging portion of the second refractory metal emitter electrode 5b.

The base electrodes 7 are disposed on the surface of the base layer 3 on opposite sides of the emitter layer 4, self-aligned with the emitter layer 4. The base electrode material 7a, which is deposited when forming the base electrode 7, is disposed on the second refractory metal emitter electrode 5b and on the side wall insulating films 8 at the side surfaces of the overhanging portion of the second refractory metal emitter electrode 5b. The base electrode 7 has a thickness of about 7000 Å and the distance between the emitter layer 4 and the base electrode 7 is about 0.3 μm. The base layer 3 comprises p⁺-GaAs, the collector layer 2 comprises n-GaAs, and the emitter layer 4 comprises n⁺-InGaAs. The first refractory metal emitter electrode 5a comprises WSi and the second refractory metal emitter electrode 5b comprises W. The base electrode 7 is Pt/Ti/Pt/Au in this order.

Figure 13:
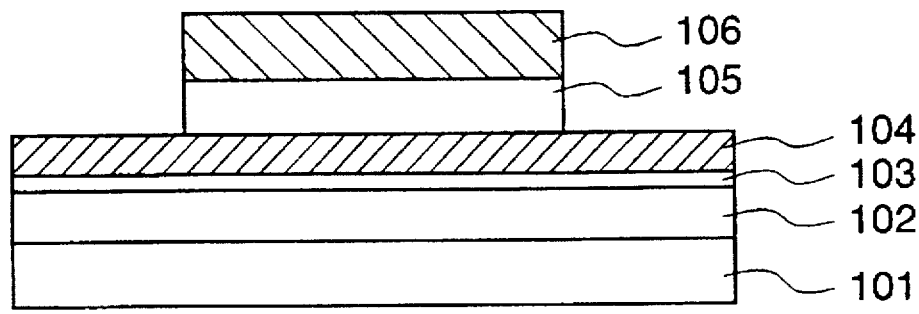
FIGS. 13(a)–13(c) are cross-sectional views illustrating a method of fabricating a semiconductor device according to the prior art.
Figure 13:
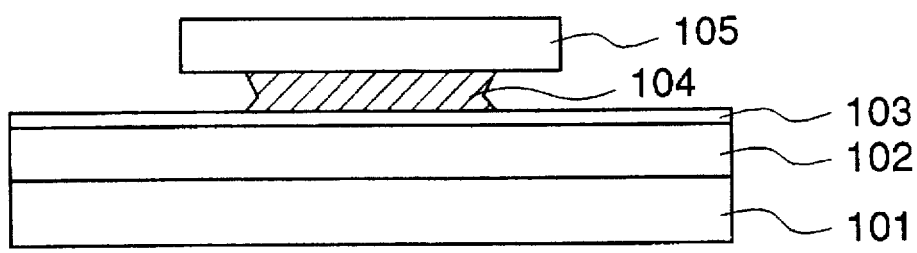
Figure 13:
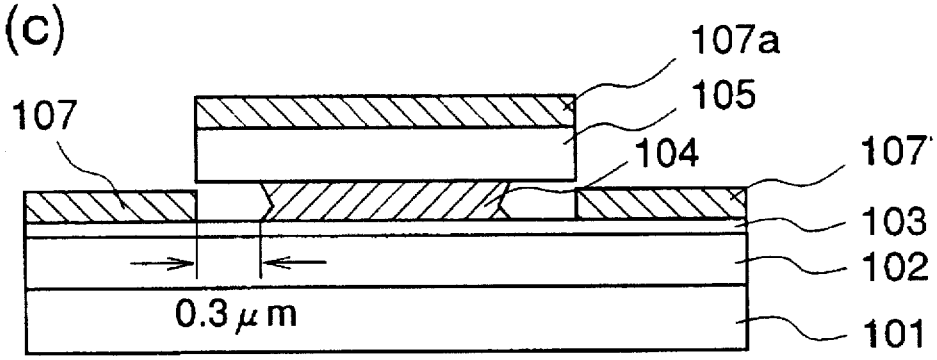
Figure 14:
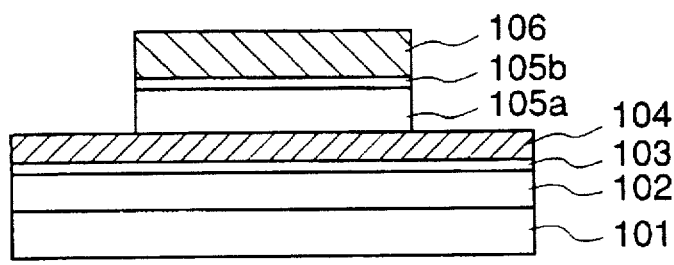
FIGS. 14(a)–14(e) are cross-sectional views illustrating yet another prior art semiconductor device and a method of fabricating the device.
Figure 14:
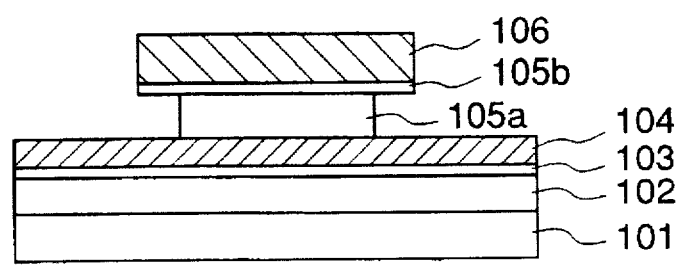
Figure 14:
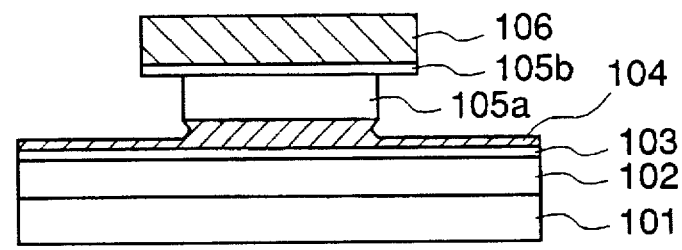
Figure 14:
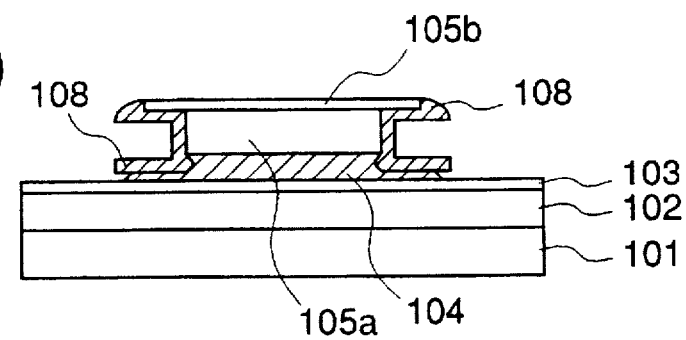
Figure 14:
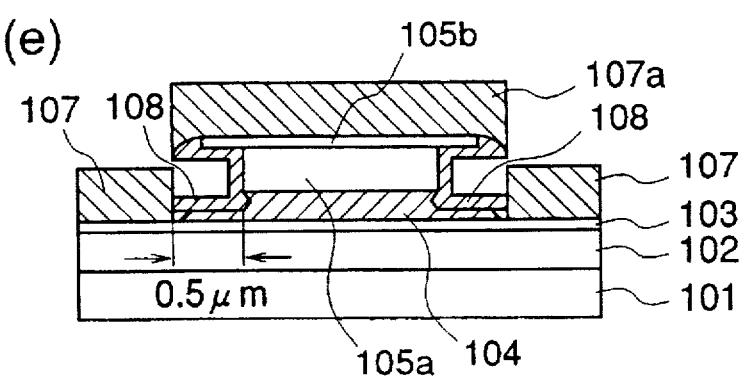

In the prior art semiconductor device as shown in FIGS. 13(c) and 14(e), since a reduction in the distance between the emitter layer and the base electrode and an increase in the thickness of the base electrode cannot be realized simultaneously, the base resistance cannot be minimized. In the semiconductor device according to the present invention, however, since the distance between the emitter layer 4 and the base electrode 7 is about 0.3 μm and the base electrode 7 is about 7000 Å thick, the base resistance can be reduced relative to the prior art device, and the high frequency characteristics of the device are improved.

Figure 2:
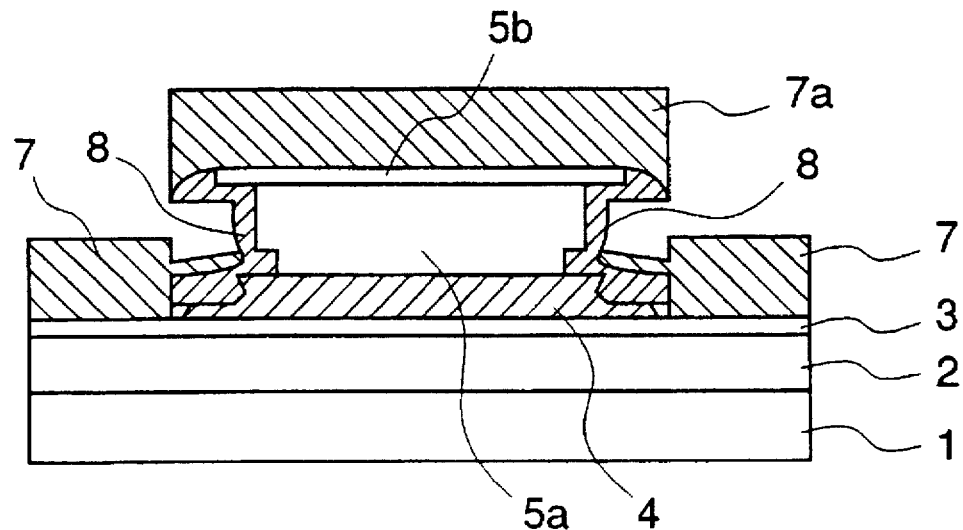
FIGS. 2(a) and 2(b) are cross-sectional views illustrating the semiconductor device according to the first embodiment of the present invention.
Figure 2:
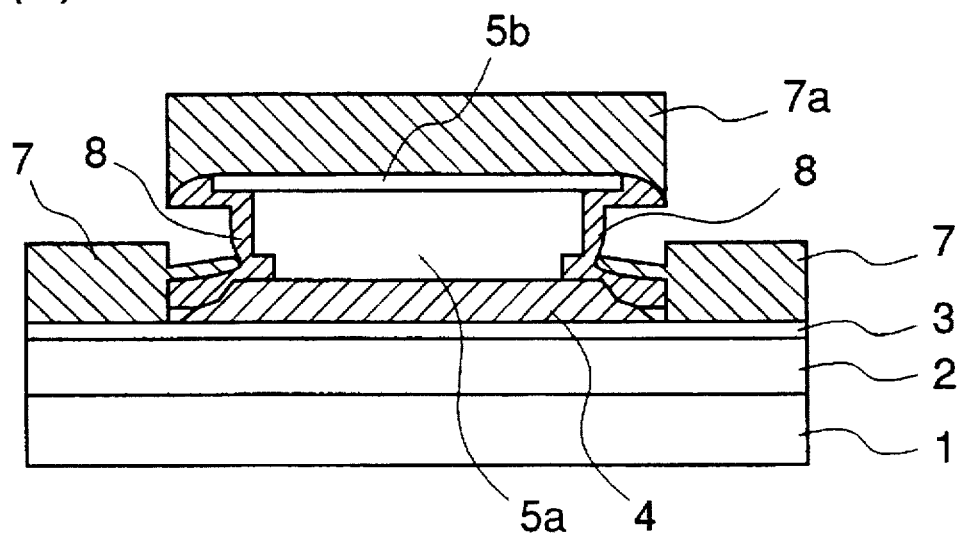
Figure 15:
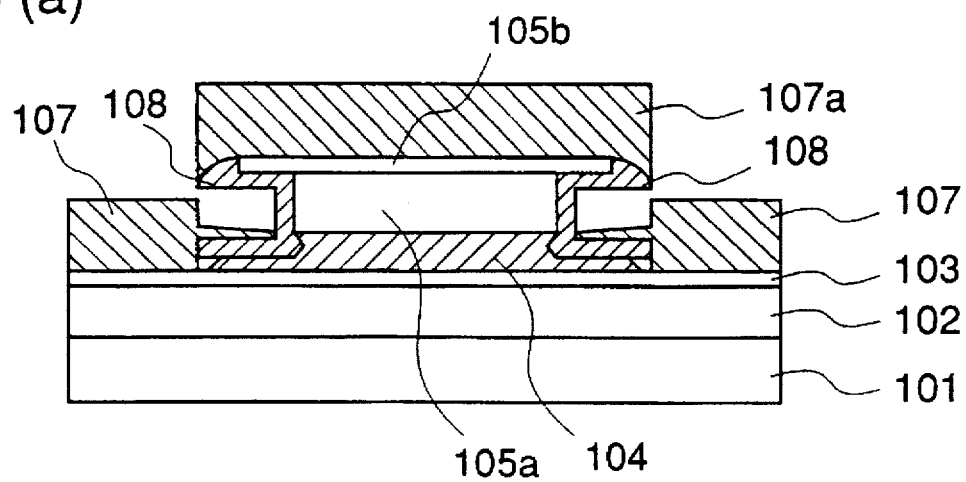
FIGS. 15(a)–15(b) are cross-sectional views for explaining problems in the method of FIGS. 14 (a)–14(e).
Figure 15:
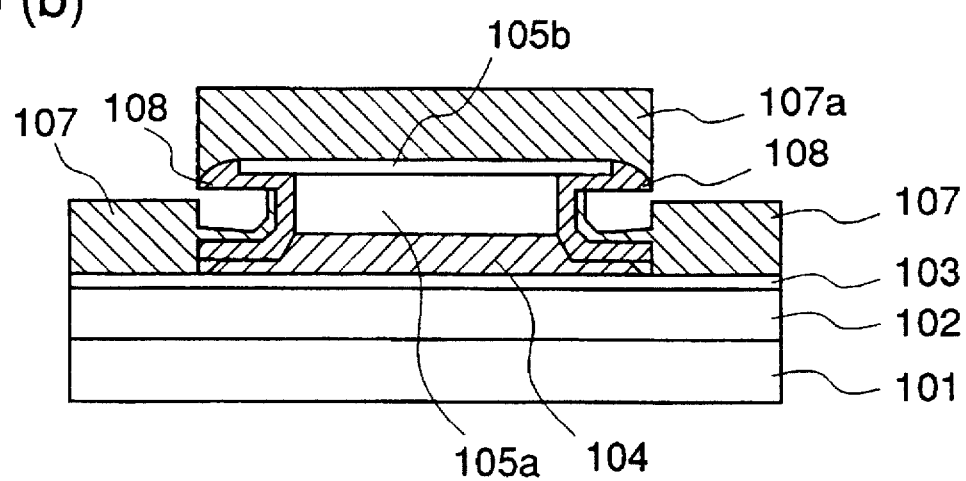

FIGS. 2(a) and 2(b) show the base electrode 7, which is deposited on the side wall insulating film 8, where the emitter layer is formed in a reverse mesa shape and a forward mesa shape, respectively. As shown in FIGS. 15(a) and 15(b), since in the prior art semiconductor device shown in FIGS. 14(a)–14(e), when the base electrode 10 is formed in a forward mesa Shape, the base electrode 107 contacts the side surface of the side wall insulating film 108, electrical separation between the emitter and base was difficult to achieve reliably. On the contrary, since, in the semiconductor device of the present invention, the first refractory metal emitter electrode 5a is undercut at the connecting portion by the emitter layer 4 where the width of the emitter electrode is small, even when the emitter layer 4 is formed in a forward mesa direction, the base electrode material is undercut and the base electrode material does not contact the side surface of the side wall insulating film 8 as shown in FIG. 2(b). Accordingly, electrical separation between the emitter and base can be obtained reliably.

In the semiconductor device according to the first embodiment, the distance between the base electrode 7 and the emitter layer 4 of the HBT can be minimized, to about 0.3 μm, and, simultaneously, the base electrode 7 can be thickened to about 7000 Å, whereby the base resistance is minimized and the high frequency characteristics of the device are improved. In addition, since the first refractory metal emitter electrode 5a is narrow in the vicinity of the contact with the emitter layer 4, electrical separation between the emitter and base can be obtained reliably. Because the surface of the base layer 3 is not exposed, recombination at the surface of the base layer is suppressed.

In the method of fabricating the semiconductor device according to this first embodiment, since diagonal ion milling is not required, deterioration of the device characteristics and variations in the device characteristics can be suppressed. Further, since no dry etching of the compound semiconductor layers is required, the processing cost can be reduced.

In the first embodiment of the present invention, the first refractory metal emitter electrode 5a and the second refractory metal emitter electrode 5b comprise WSi and W, respectively. However, these two electrodes may be other refractory metals in any combination that enables selective etching. For example, when the first refractory metal emitter electrode 5a comprises WSi, the second refractory metal emitter may comprise Au, Pt, or Pd.

Embodiment 2

A method of fabricating a semiconductor device according to a second embodiment of the present invention comprises, as shown in FIGS. 3(a)–3(e), successively laminating a first active layer (base layer 3), a second active layer (emitter layer 4), and first and second metal layers (first refractory metal emitter electrode 5a and second refractory metal emitter electrode 5b), each having a different etching selectivity and serving as a first electrode on a main surface of a semiconductor substrate (compound semiconductor substrate 1); forming a resist pattern 6 on the second metal layer 5b and etching the second and the first metal layers 5b and 5a using the resist pattern 6 as a mask; etching the second active layer 4 using the just-etched metal layers 5a and 5b as a mask so that the thickness of the second active layer 4 is smaller in a region where the metal layers 5a and 5b are not disposed and the width of the contact of the second active layer 4 with the first metal layer 5a is smaller than the width of the metal layer 5a in a region where the metal layers 5a and 5b are disposed; selectively side-etching the first metal layer 5a so that the width of the first metal layer 5a is smaller than the width of the second metal layer 5b and the width of the first metal layer 5a is still smaller in the vicinity of the contact with the second active layer 4; after removal of the resist 6, depositing an insulating film on the entire surface; etching back the insulating film to leave a continuous insulating film 8 at a part of the surface of the second active layer 4, the side surface of the first metal layer 5a, and the lower surface and the side surface of the overhanging portion of the second metal layer 5b protruding from the first metal layer 5a; using the insulating film 8 and the metal layer as a mask, etching the second active layer 4 so that the second active layer 4, other than at the mask, is removed and the second active layer 4 below the mask is side-etched; depositing a metal layer 7a, a portion of which is deposited on the first active layer 3, as a second electrode 7 on the first active layer 3 exposed on opposite sides of the first electrode 5, the upper surface of the second metal layer 5b, and the insulating film 8 at the side surface of the overhanging portion of the second metal layer 5b. Therefore, a method of fabricating a semiconductor device at a low cost and having superior characteristics, without deterioration of the device characteristics and variations in the device characteristics, is realized.

Figure 3:
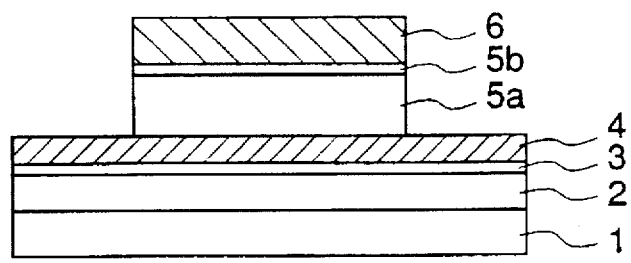
FIGS. 3(a)–3(c) are cross-sectional views illustrating a method of fabricating a semiconductor device according to a second embodiment of the present invention.
Figure 3:
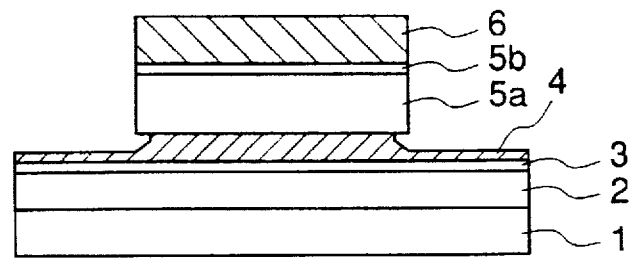
Figure 3:
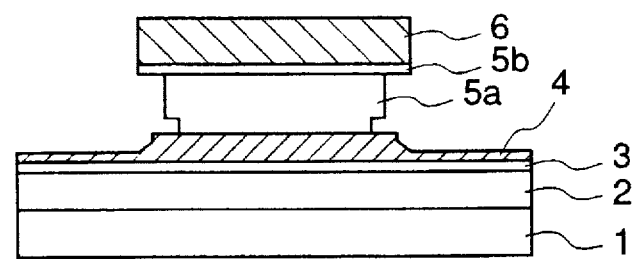
Figure 3:
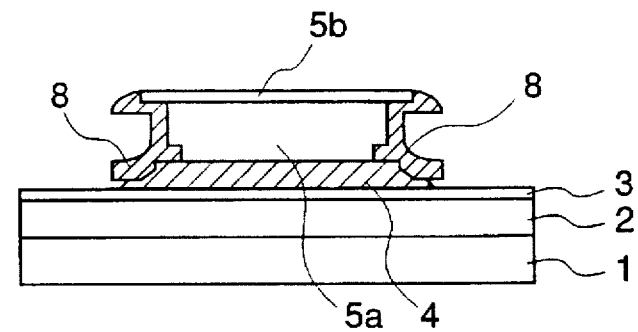
Figure 3:
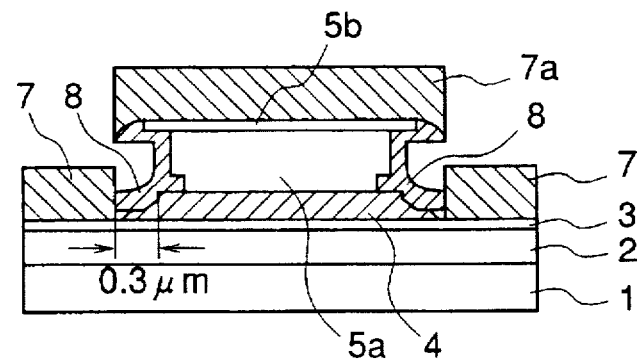

More particularly, on a compound semiconductor substrate 1, a (n-GaAs) collector layer 2, a (p⁺-GaAs) base layer 3, and an (n⁺-InGaAs) emitter layer 4 about 3000 Å thick are epitaxially grown, a first refractory metal emitter electrode 5a comprising WSi is deposited to a thickness of about 5000 Å and the second refractory metal emitter electrode 5b comprising W is deposited to a thickness of about 1000 Å. A resist pattern 6 is formed on the electrode 5a and, using the resist pattern as a mask, the first refractory metal emitter electrode 5a and the second refractory metal electrode 5b are etched as shown in FIG. 3(a). The first refractory metal emitter electrode 5a comprises WSi and the second refractory metal emitter electrode 5b comprises W, respectively, so that selective etching can be performed. As shown in FIG. 3(b), the emitter layer 4 is etched using the first and the second refractory metal emitter electrodes 5a and 5b as a mask. The etching of the emitter layer 4 is small so that the emitter layer 4 becomes thin in the emitter layer 4 region where the first and the second refractory metal electrodes 5a and 5b are not present and the width of the contact of the emitter layer 4 with the first refractory metal emitter electrode 5a is smaller than the width of the first refractory metal electrode 5a on the emitter layer 4 region where the first and the second refractory metal electrodes 5a and 5b are present. Next, the refractory metal emitter electrode 5a is side-etched by RIE or ECR etching using a gas mixture, such as CF₄+O₂ or SF₆+CHF₃, as shown in FIG. 3(c). The process of etching is illustrated in FIGS. 4(a)–4(c).

Figure 4:
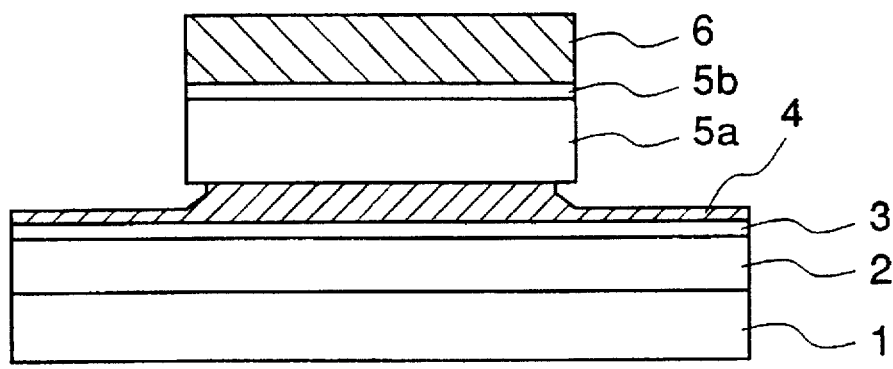
FIGS. 4(a)–4(c) are cross-sectional views illustrating a method of fabricating a semiconductor device according to the second embodiment of the present invention.
Figure 4:
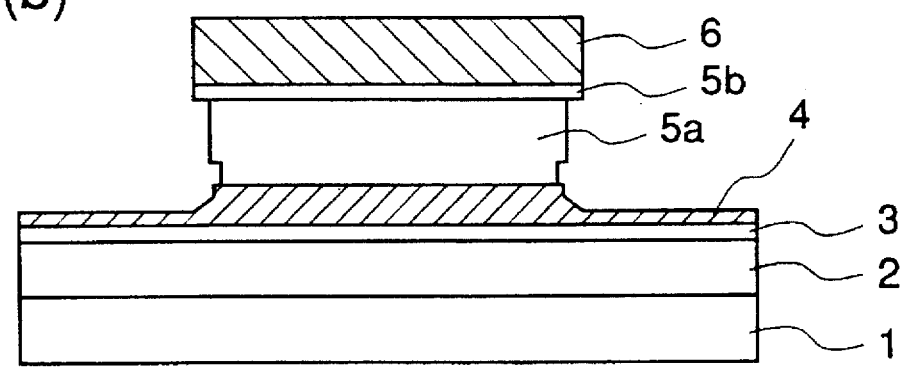
Figure 4:
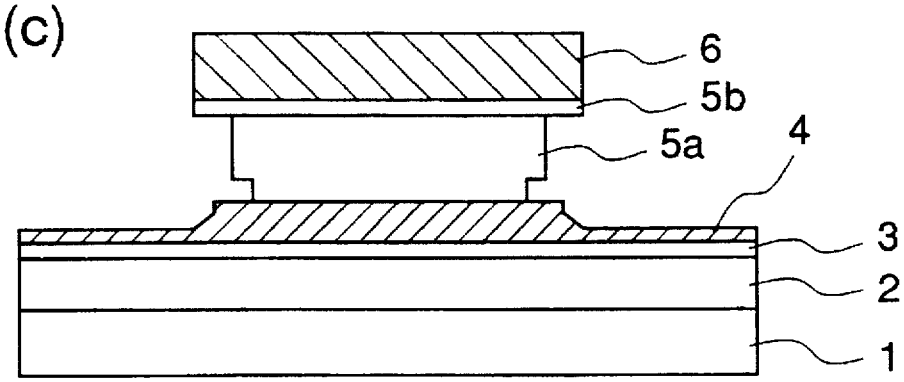

Since, as shown in FIG. 4(a), the width of the contact of the emitter layer 4 with the first refractory metal emitter electrode 5a is smaller than the width of the first refractory metal emitter electrode 5a, when the first refractory metal emitter electrode 5a is etched, etching starts not only at the side surface of the first refractory metal electrode 5a but at the lower surface of the first refractory metal electrode 5a that is not in contact with the emitter layer 4. When etching proceeds, the first refractory metal emitter electrode 5a has, in cross-section, a T-shaped configuration as shown in FIG. 4(c).

Figure 5:
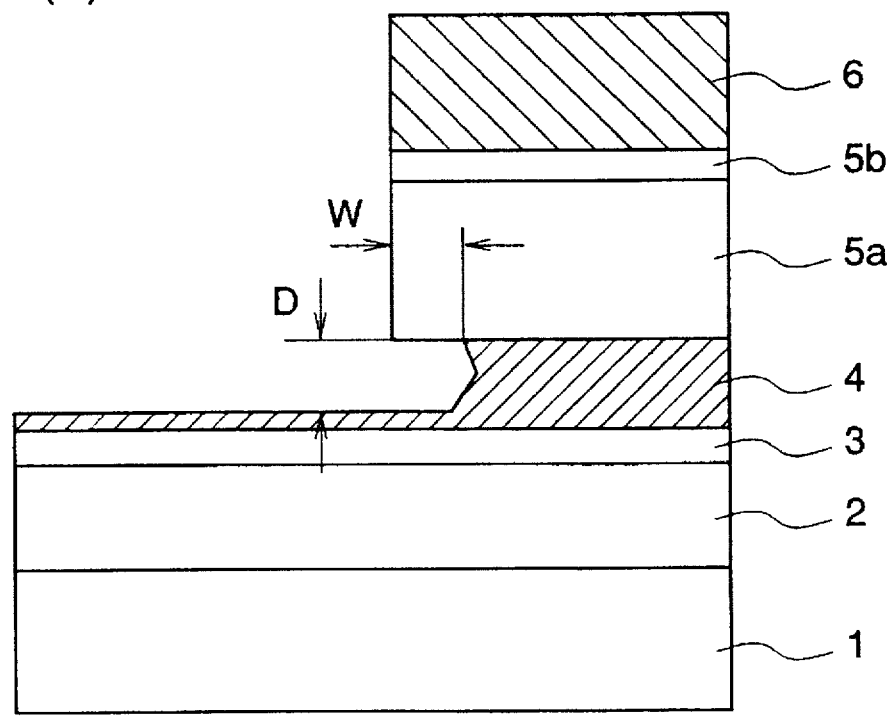
FIGS. 5(a)–5(b) are cross-sectional views illustrating the emitter electrode and side etching directly below the emitter electrode according to the second embodiment of the present invention.
Figure 5:
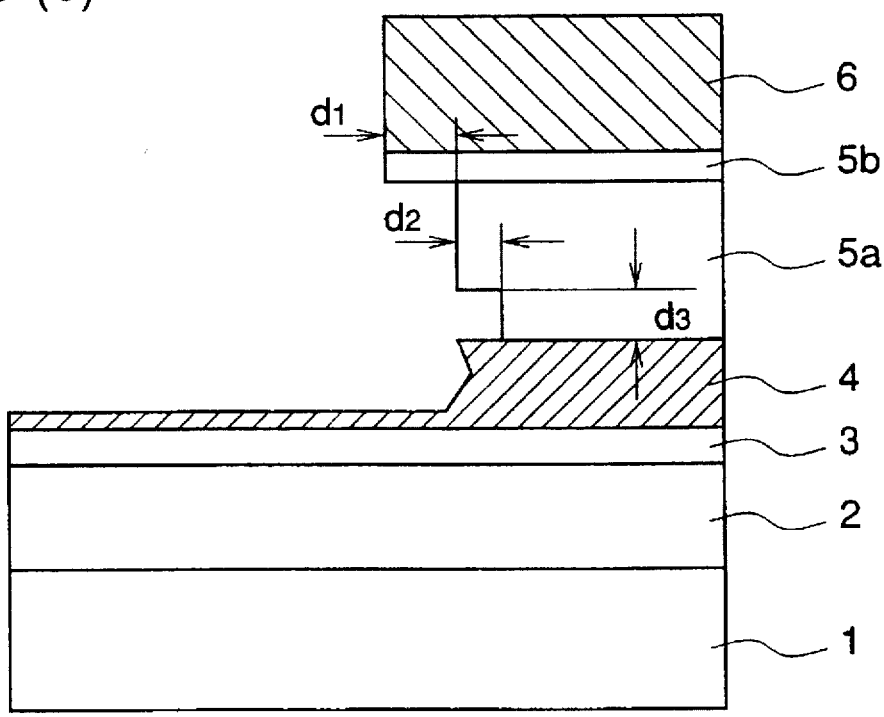
Figure 6:
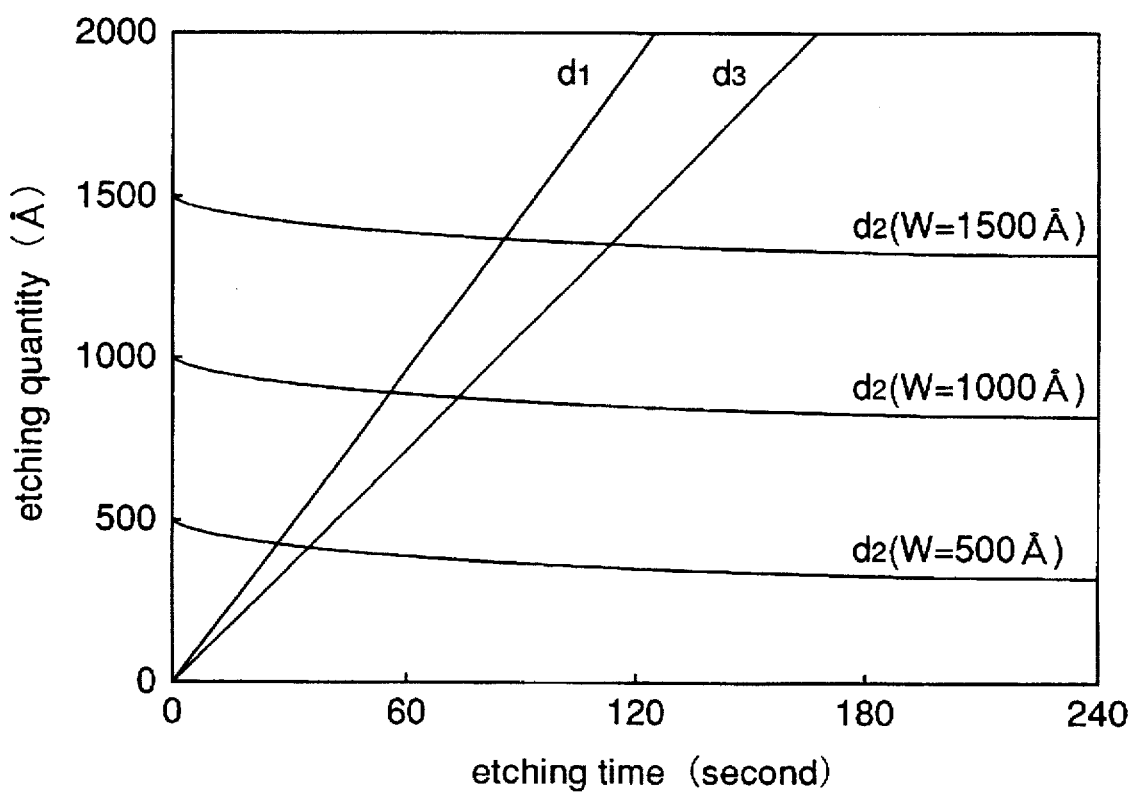
FIG. 6 is a diagram of etching data showing the manner of processing the emitter electrode of the semiconductor device according to the second embodiment of the present invention.

In order to show the advance of the etching, the dimensions of the respective portions will be defined as shown in FIGS. 5(a) and 5(b). Characters D and W are for explaining a mesa shape produced when the emitter layer 4 is etched, as shown in. FIG. 3(b). Since in the present invention the emitter layer 4 is isotropically etched by wet etching, D approximately equals W. In FIG. 5(b), character d1 represents the side-etching depth at an upper portion of the first refractory metal emitter electrode 5a, and characters d2 and d3 represent the side-etching depths at a lower portion of the first refractory emitter electrode 5a. FIG. 6 shows relationship between time and etching, i.e., d1, d2, and d3, of the first refractory metal electrode 5a when the side-etching dimension W of the emitter layer 4 is 500, 1000, and 1500 Å, respectively, in the step of FIG. 3(c), i.e., in the step of FIGS. 4(a)–4(c).

As shown in FIG. 6, d1 increases proportionally with the etching time in the side-etching of the present invention. In addition, d3 also increases proportionally with the etching time in the side-etching of the present invention. However, since this etching is from the lower side of the first refractory metal emitter electrode 5a, the etching depth is smaller than d1. On the contrary, d2 starts from W shown in FIG. 5(a) and is gradually reduced with the passage of time and then is saturated. This is because, at the beginning of the etching, the etching rate at the contacting portion of the first refractory metal emitter electrode 5a with the second refractory metal emitter electrode 5b is larger than the etching rate at the contact of the first refractory metal emitter electrode 5a with the emitter layer 4. d3 gradually increases with the advance of the etching and, as a result, the etching rates become approximately equal to each other. In FIG. 6, the etching quantities d1 and d3 do not depend on W, while d2 depends on W. Therefore, when a large side-etching is desired to reach the contact of the first refractory metal emitter electrode 5a with the second refractory metal emitter electrode 5b, etching must be conducted for a long time. In addition, when a large side-etching is desired to reach the first refractory metal emitter electrode 5a with the second refractory metal emitter electrode 5b, side-etching W when the emitter layer 4 is etched, the W film should be thick. Since the side-etching of W is more than 1500 Å in this second embodiment, large side-etching (cutting) of the contact of the first refractory metal emitter electrode 5a with the emitter layer 4 is possible. In this way, in the step of FIG. 3(c), by adjusting the etching time and the side-etching of the emitter layer 4, the first refractory metal emitter electrode 5a can have a desired configuration.

Next, after the removal of the resist pattern 6, an insulating film is deposited on the entire surface and etched back. Then, since the second refractory metal emitter electrode 5b of an overhanging portion functions as a mask, the side wall insulating film 8 remains on a part of the emitter layer 4, on the side surface of the first refractory emitter electrode 5a, and on the lower surface and the side surface of the overhanging portion of the second refractory metal emitter electrode 5b protruding from the first refractory metal emitter electrode 5a. Thereafter, the base electrode metal 7a is evaporated and deposited on the exposed base layer 3, on the second refractory metal emitter electrode 5b, and on the side wall insulating film 8 on the side surface of the overhanging portion of the second refractory metal emitter electrode 5b. The base electrode metal 7a is formed by laminating Pt/Ti/Pt/Au in this order. In addition, the thickness of the base electrode metal 7a can be about 7000 Å because the side-etching enters the first refractory metal emitter electrode 5a. Finally, if the base electrode metal 7a not required is lifted off, the base electrode 7 can be formed self-aligningly, completing the semiconductor device shown in FIG. 3(e). The distance between the base electrode 7 and the emitter layer 4 can be approximately 0.3 μm, approximately equal to the side-etching of the emitter layer 4, i.e., the thickness of the emitter layer 4.

In the fabricating method according to the second embodiment, since diagonal ion milling is not required, the deterioration of the device characteristics and variations in the device characteristics can be suppressed. In addition, since no process of dry etching of the compound semiconductor layers is required, the processing cost is reduced.

In the fabricating method according to the second embodiment, the distance between the base electrode 7 and the emitter layer 4 of the HBT can be minimized to about 0.3 μm and, simultaneously, the thickness of the base electrode 7 can be made about 7000 Å, whereby the base resistance is reduced and the high frequency characteristics of the device are improved. Since etching is performed so that the width in the vicinity of the contact of the first refractory metal emitter electrode 5a that is disposed on the emitter layer 4 with the emitter layer 4 is reduced, electrical separation between the base and emitter can be achieved reliably. In addition, in the completed semiconductor device, the surface of the base layer 3 is not exposed and recombination at the surface of the emitter layer is suppressed.

According to the second embodiment of the invention, the first refractory metal emitter electrode 5a and the second refractory metal emitter electrode 5b comprise WSi and W, respectively. However, these two electrodes may be other refractory metals in any combination that enables selective etching. For example, when the first refractory metal emitter electrode 5a comprises WSi, the second refractory metal emitter may comprise Au, Pt, or Pd.

Embodiment 3

A method of fabricating a semiconductor device according to a third embodiment of the present invention wherein two or more semiconductor elements are formed on the same substrate comprises, as shown in FIGS. 7(a)–7(d), 8(a)–8(d), and 9(a)–9(d), successively laminating a first active layer (base layer 3), a second active layer (emitter layer 4), first and second metal layers (first refractory metal emitter electrode 5a, second refractory metal emitter electrode 5b), each having a different etching selectivity and serving as a first electrode (refractory metal emitter electrode 5) and an insulating film 9 on a main surface of a semiconductor substrate (compound semiconductor substrate 1); forming a resist pattern 6 on the insulating film 9 at a first semiconductor element formation region, and etching the insulating film 9 and the second and first metal layers 5b and 5a using the resist pattern 6 as a mask; after removal of the resist 6, forming a second semiconductor element (resistor element 10) at a prescribed position on the second active layer 4; after covering the second semiconductor element 10 with a resist 11, etching the second active layer 4 using the etched metal layers 5a and 5b and the resist 11 covering the second semiconductor element as a mask, so that the second active layer 4 is thinned at a region where the metal layers 5a and 5b are not present and at a region where the resist 11 covering the semiconductor element is not present, and the width of the contact of the second active layer 4 with the first metal layer 5a is smaller than the width of the first metal later 5a at a region where the metal layers 5a and 5b are present; selectively side-etching the first metal layer 5a so that the width of the first metal layer 5a is smaller than the width of the second metal layer 5b and the width of the first metal layer 5a is still smaller in the vicinity of the contact with the second active layer 4; after the removal of the insulating film 9 and the resist 11, covering the second semiconductor element, depositing an insulating film on the entire surface of the substrate; etching back the insulating film to leave a continuous insulating film 8 on a portion of the surface of the second active layer 4, a side surface of the first metal layer 5a, and the lower surface and the side surface of the overhanging portion of the second metal layer 5b protruding from the first metal layer 5a; after covering the second semiconductor element 10 with a resist 12, etching the second active layer 4 using the continuous insulating film 8, the metal layers 5a and 5b, and the resist 12 covering the second semiconductor element as a mask, so that the second active layer 4, other than at the mask portion, is removed and the second active layer 4 under the mask is side etched; forming a resist on the second semiconductor element 10 and the surface of the first active layer 3, depositing the second electrode material 7a on the entire surface and lifting off to form a second electrode 7 self-aligningly. Thereby, a semiconductor device including a plurality of elements including a semiconductor element in which the base resistance is reduced and electrical separation between the base and emitter is achieved reliably can be obtained easily and with high yield.

Figure 7:
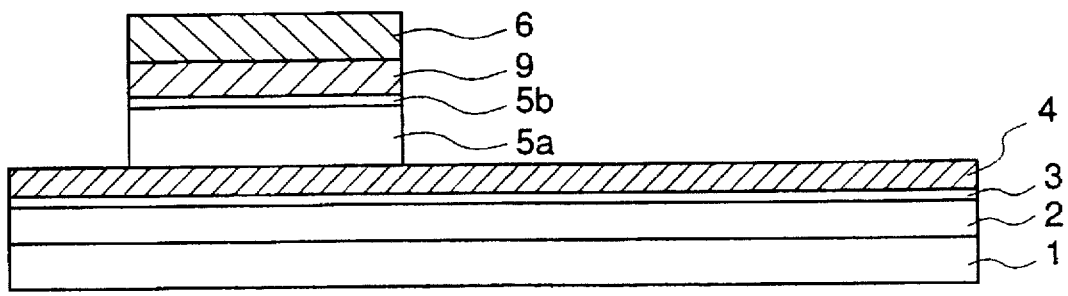
FIGS. 7(a)–7(d) are cross-sectional views illustrating a method of fabricating a semiconductor device according to a third embodiment of the present invention.
Figure 7:
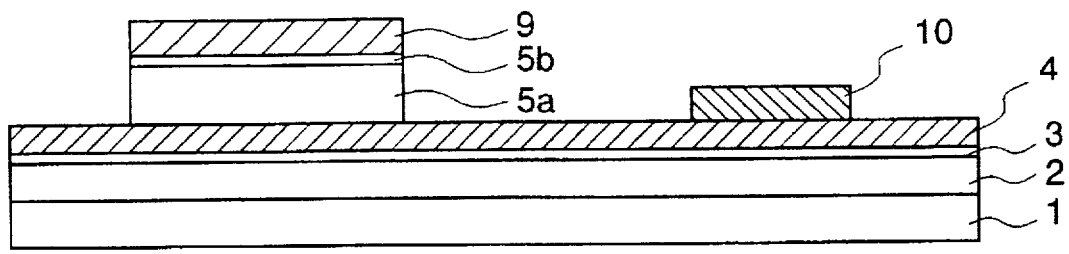
Figure 7:
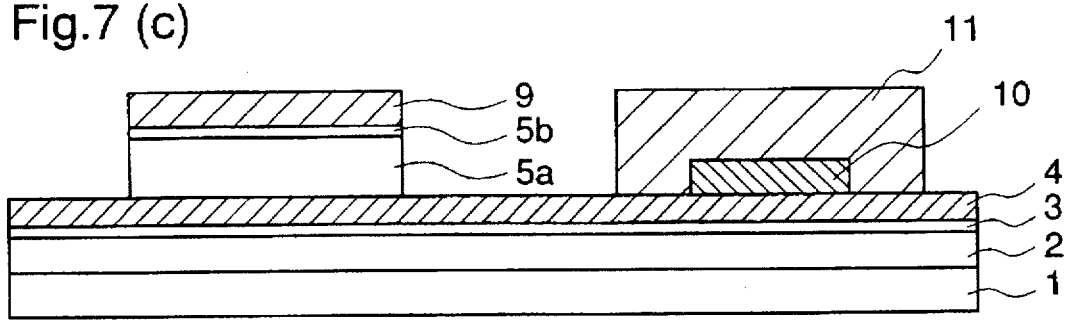
Figure 7:
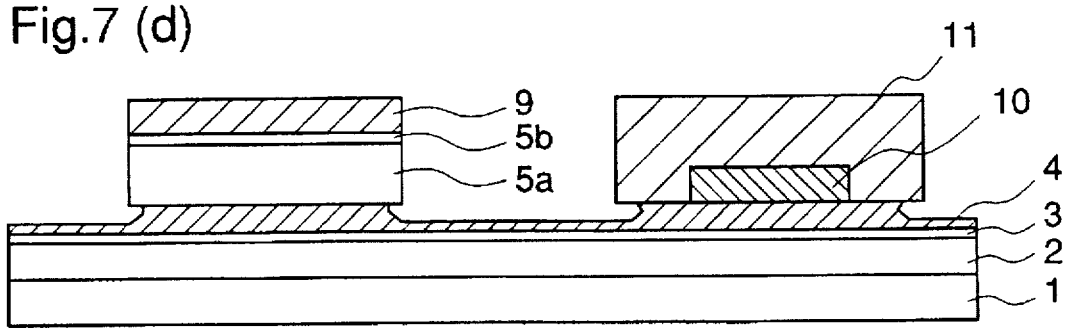

More particularly, FIGS. 7(a)–7(d), 8(a)–8(d), and 9(a)–9(d) respectively show a method of fabricating art MMIC (Monolithic Microwave IC) wherein other elements such as a resistor and a capacitor, in addition to an HBT according to the first embodiment, are formed on the same substrate. First of all, on an HBT epitaxial substrate, including the compound semiconductor substrate 1, the collector layer 2, the base layer 3, and the emitter layer 4, about 3000 Å thick, are epitaxially grown. A metal layer that becomes a first refractory metal electrode 5a is deposited to a thickness of about 5000 Å, a metal layer that becomes the second refractory metal emitter electrode 5b is deposited to a thickness of about 1000 Å, and, further, an insulating film 9 is deposited to a thickness of about 3000 Å. Thereafter, the resist pattern 6 is formed on the insulating film 9 and, using the resist pattern 6 as a mask, the metal layer 5b that becomes the second refractory metal emitter electrode and the metal layer that becomes the first refractory metal emitter electrode 5a are etched as shown in FIG. 7(a). The base layer 3 comprises p$^+$-GaAs, the collector layer 2 comprises n-GaAs, the emitter layer 4 comprises n$^+$-InGaAs, the first refractory metal emitter electrode 5a comprises WSi, and the second refractory metal emitter electrode 5b comprises W, respectively. In addition, the insulating film comprises an SiO$_2$ film. Because the SiO$_2$ film has a sufficiently different etching selectivity from the second refractory metal emitter electrode 5b, when the insulating film 9 is removed, the second refractory metal emitter electrode 5b is not etched in the etching step.

Figure 8:
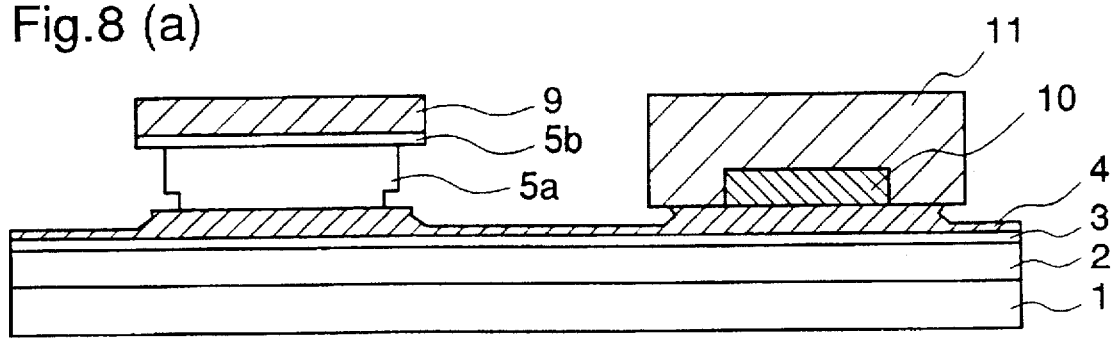
FIGS. 8(a)–8(d) are cross-sectional views illustrating a method of fabricating a semiconductor device according to the third embodiment of the present invention.
Figure 8:
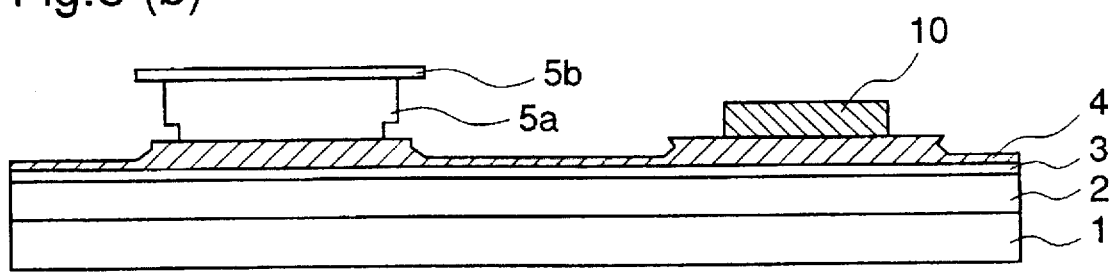
Figure 8:
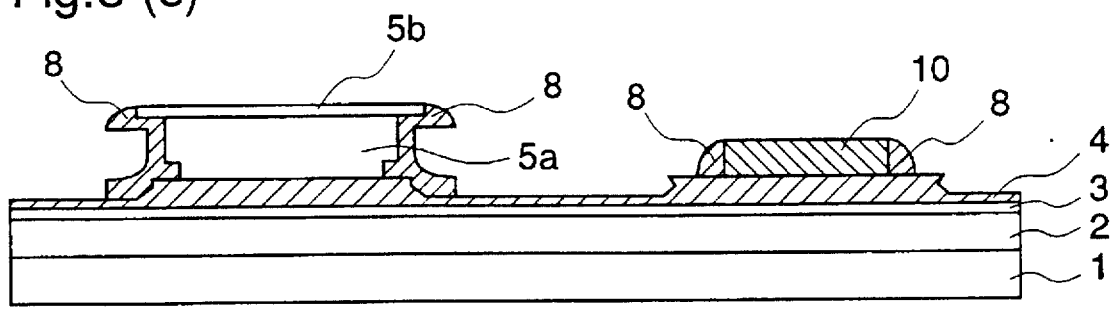
Figure 8:
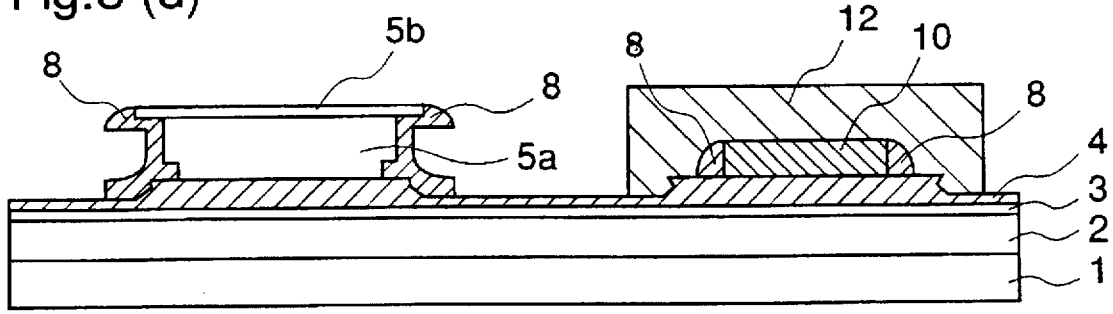

In the step of FIG. 7(b), after the removal of the resist pattern 6, a semiconductor element, such as a resistor 10, is formed on the emitter layer 4. In the step of FIG. 7(c), the resist 11 is patterned to protect the resistor element 10. In the step of FIG. 7(d), the emitter layer 4 is etched, as in FIG. 3(b) according to the second embodiment, whereby the emitter layer 4 is made thinner in the region where the first and the second refractory metal emitter electrodes 5a and 5b are present and the width of contact of the emitter layer 4 with the first refractory metal emitter electrode 5a is narrower than the width of the first refractory metal emitter electrode 5a. In the step of FIG. 8(a), the first refractory metal emitter electrode 5a is selectively side-etched, as in FIGS. 4(a)–4(c) according to the second embodiment, whereby the width of the first refractory metal emitter electrode 5a is smaller than the width of the second refractory metal emitter electrode 5b and that width is further smaller in the vicinity of the contact of the first refractory metal emitter electrode 5a with the emitter layer 4.

Figure 9:
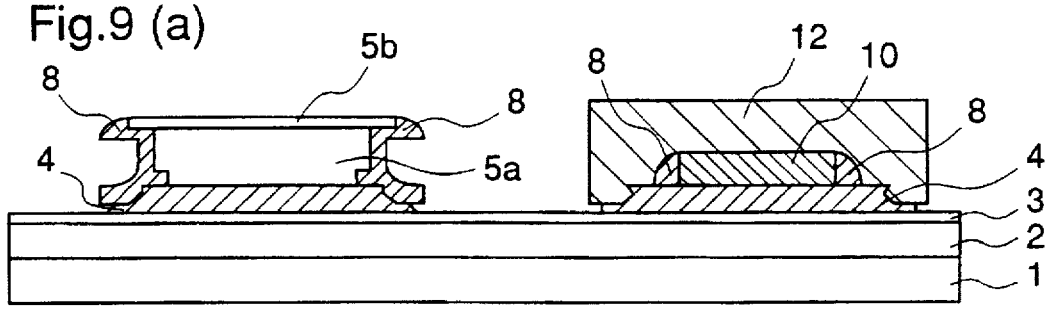
FIGS. 9(a)–9(d) are cross-sectional views illustrating a method of fabricating a semiconductor device according to the third embodiment of the present invention.
Figure 9:
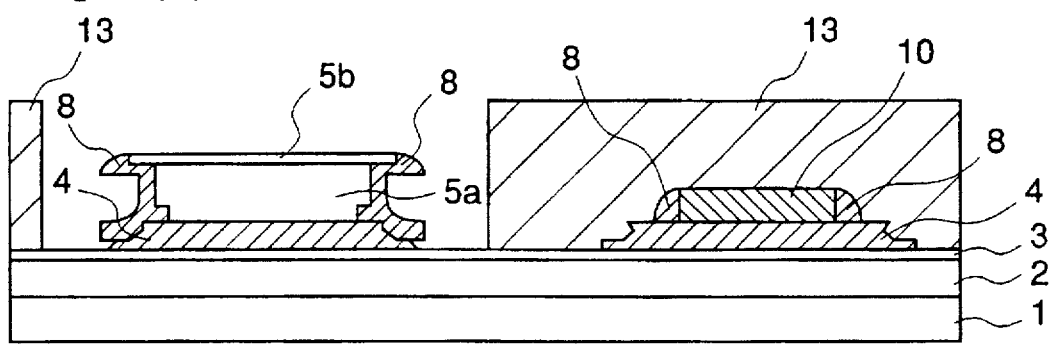
Figure 9:
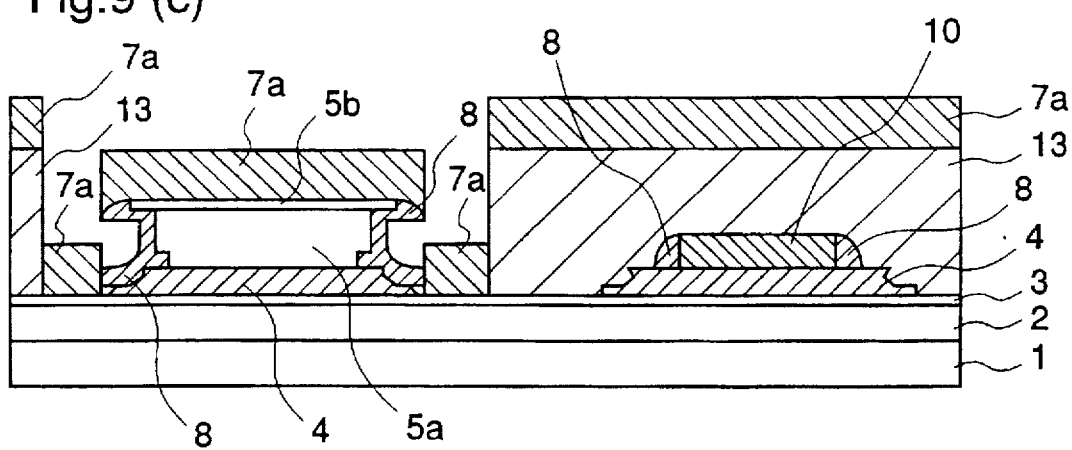
Figure 9:
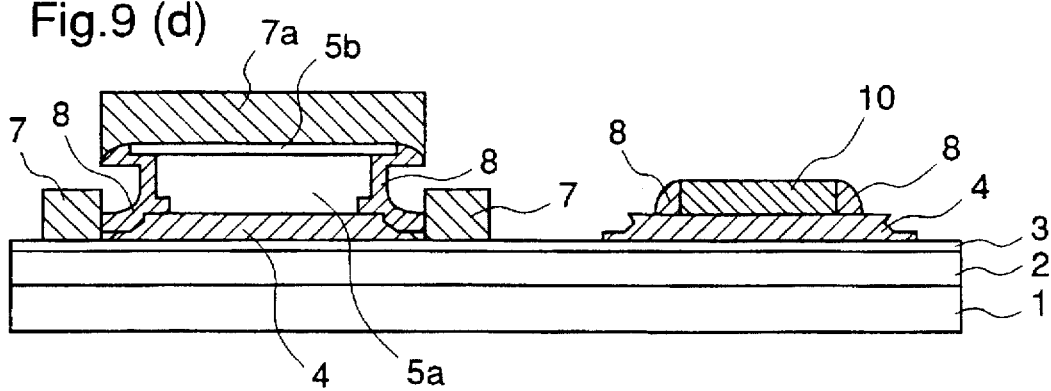
Figure 10:
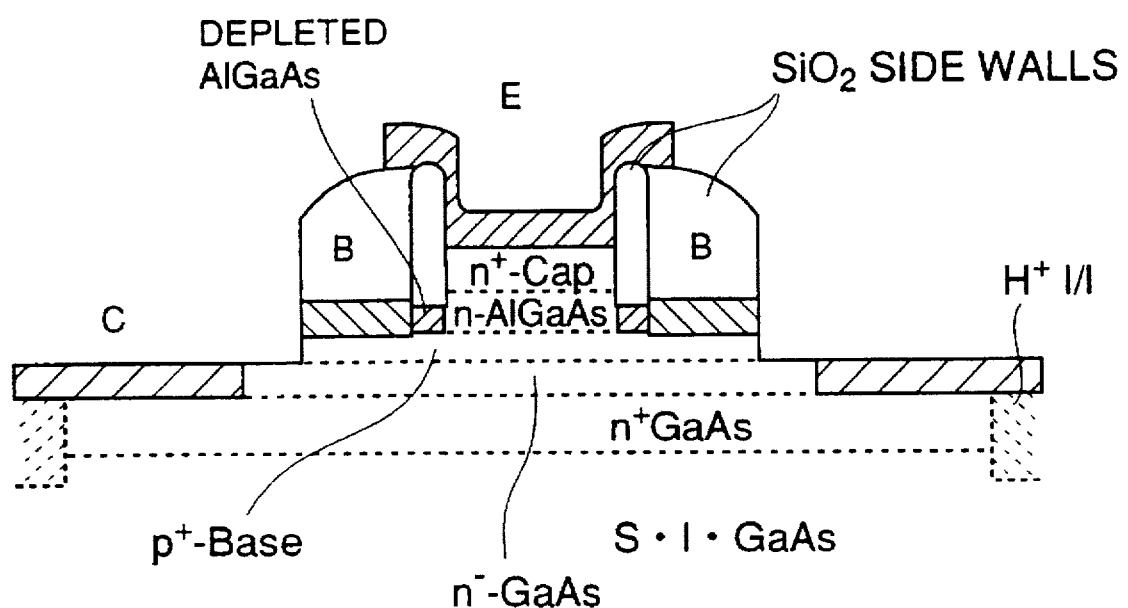
FIG. 10 is a cross-sectional view illustrating a prior art semiconductor device.
Figure 11:
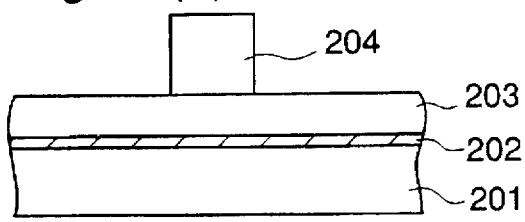
FIGS. 11(a)–11(i) are cross-sectional views illustrating a prior art method of fabricating the semiconductor device shown in FIG. 10.
Figure 11:
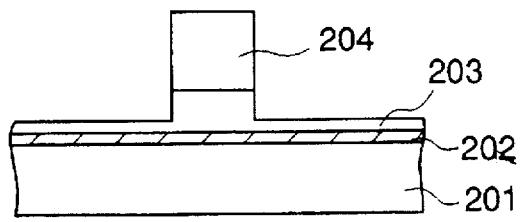
Figure 11:
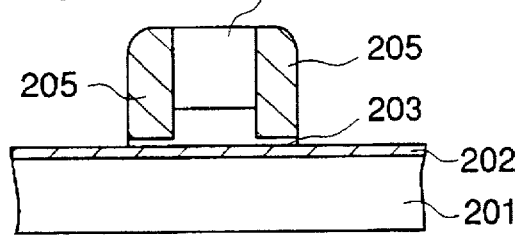
Figure 11:
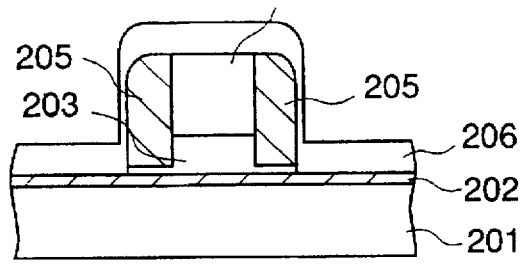
Figure 11:
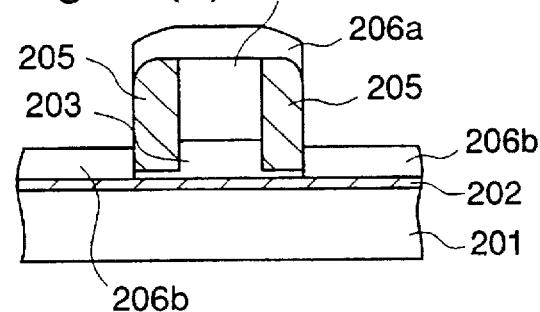
Figure 11:
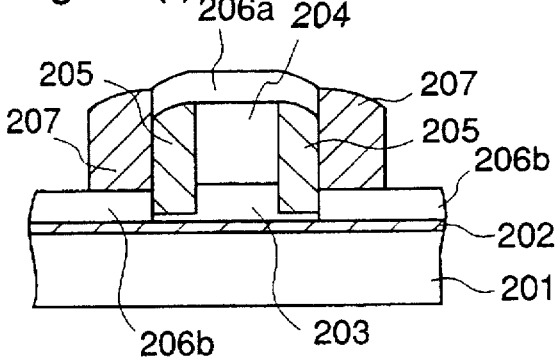
Figure 11:
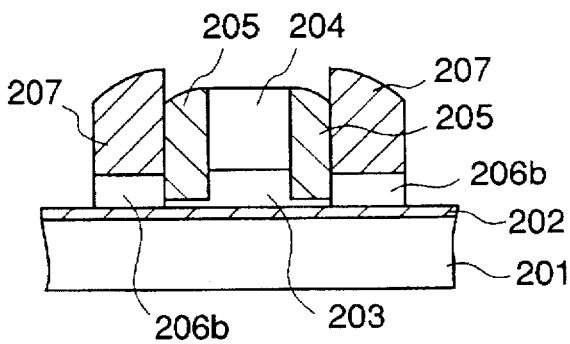
Figure 11:
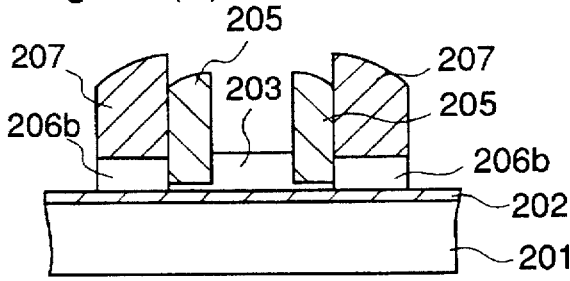
Figure 11:
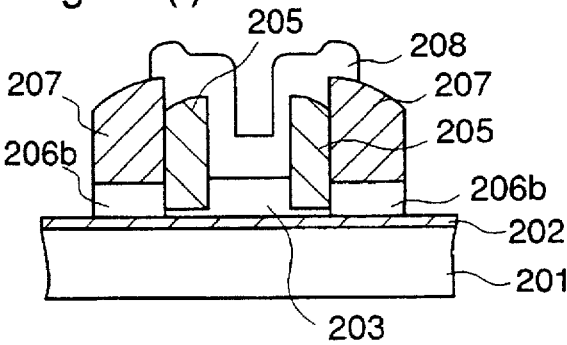
Figure 12:
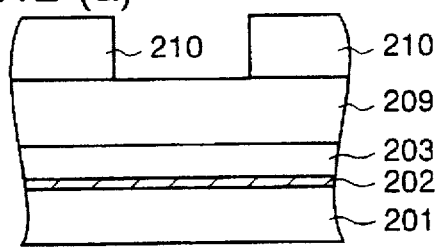
FIGS. 12(a)–12(k) are cross-sectional views illustrating a method of fabricating a semiconductor device according to the prior art.
Figure 12:
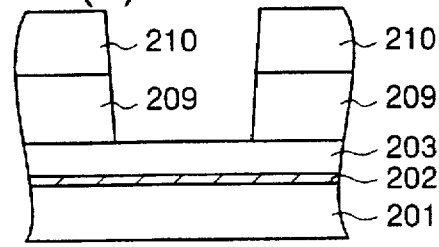
Figure 12:
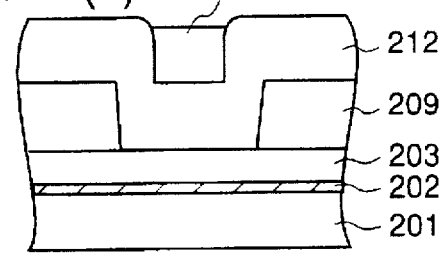
Figure 12:
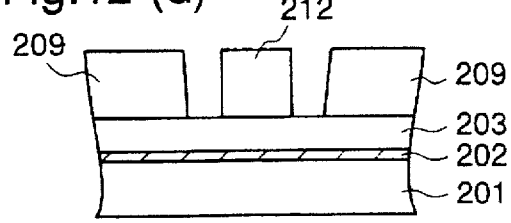
Figure 12:
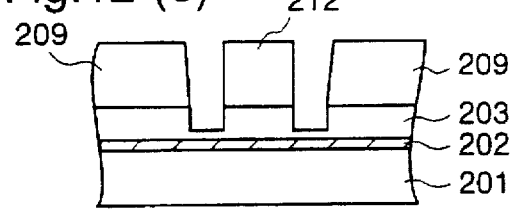
Figure 12:
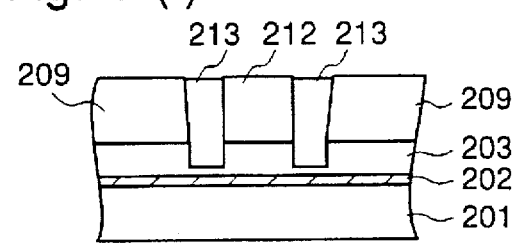
Figure 12:
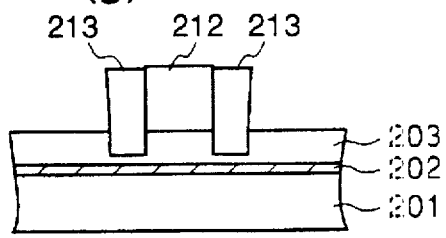
Figure 12:
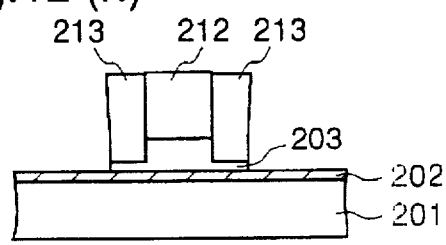
Figure 12:
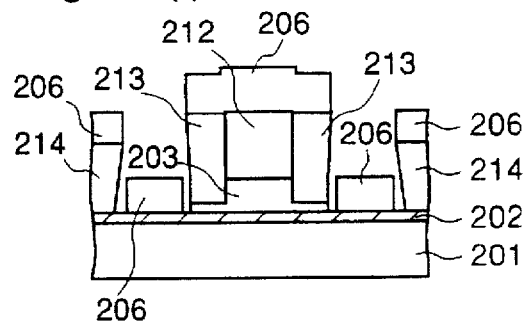
Figure 12:
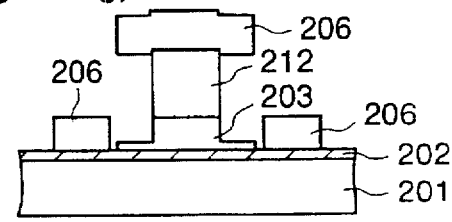
Figure 12:
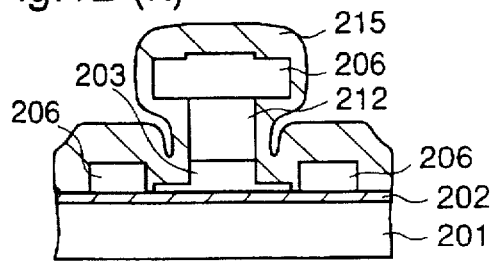

In the step of FIG. 8(b), the resist 11 and the insulating film 9 are removed. After the insulating film 9 is deposited on the entire surface, as shown in FIG. 8(c), etching back is performed to leave the side wall insulating film 8. Then, the upper surface of the resistor 10 is formed by a metal thin film, such as W, Au, and the like, having sufficient etching selectivity considering the etching back step. Further, in the step of FIG. 8(d), the resistor element 10 is protected by the resist 12. In the step of FIG. 9(a), using the side wall insulating film 8 and the resist 12 as a mask, the emitter layer 4 is etched, thereby exposing the surface of the base layer 3. In the step of FIG. 9(b), the pattern including an opening where the base electrodes 7 are produced is formed by the resist 13. In the step of FIG. 9(c), the base electrode metal 7a is deposited on the entire surface. The base electrode metal 7a is formed by successively laminating Pt/Ti/Pt/Au in this order. Finally, in the step of FIG. 9(d), unnecessary base electrode metal 7a is removed by lifting off, thereby forming the base electrode 7, self-aligned with the emitter layer 4.

In the fabricating method according to the third embodiment of the present invention, the semiconductor element according to the first embodiment is formed on the same substrate on which other semiconductor elements, such as resistors, are formed, the semiconductor element is formed while protecting the other semiconductor elements with the resists 11, 12, and 13, whereby a semiconductor device with a plurality of semiconductor elements, including the semiconductor element according to the present invention, can be easily fabricated without damaging the other semiconductor elements.

In the fabricating method according to the third embodiment, since there is no necessity of using diagonal ion milling, deterioration of the device characteristics and variations in the device characteristics are suppressed. Further, since no process of dry etching the semiconductor layer is included, the processing cost is reduced.

Furthermore, in the fabricating method according to the third embodiment, the distance between the base electrode 7 and the emitter layer 4 of the HBT can be minimized to about 0.3 μm, and, simultaneously, the thickness of the base electrode 7 can be about 7000 Å, whereby the base resistance is reduced and the high frequency characteristics of the device are improved. Since the etching is performed so that the width in the vicinity of the contact of the first refractory metal emitter electrode 5a with the emitter layer 4 is reduced, electrical separation between the base and emitter can be achieved reliably. In addition, in the completed semiconductor device, the surface of the base layer 3 is not exposed, and recombination at the surface of the emitter layer is suppressed.

In the third embodiment of the present invention, the first refractory metal emitter electrode 5a and the second refractory metal emitter electrode 5b comprise WSi and W, respectively. However, other refractory metals may be used in any combination that enables selective etching. For example, when the first refractory metal emitter electrode 5a comprises WSi, the second refractory metal emitter electrode 5b may comprise Au, Pt, or Pd.

What is claimed is:

1. A semiconductor device comprising:
    a compound semiconductor substrate;
    a first compound semiconductor active layer disposed on the compound semiconductor substrate;
    a second compound semiconductor active layer disposed on the first compound semiconductor active layer and having a configuration;
    a first electrode comprising a lower stage disposed on the second compound semiconductor active layer and having a width that is narrower at a contact with the second compound semiconductor active layer than elsewhere and an upper stage disposed on the lower stage and having an overhanging portion protruding from and wider than the lower stage;
    an insulating film continuously covering a surface of the second compound semiconductor active layer, a side surface of the lower stage of the first electrode, and a lower surface and a side surface of the overhanging portion of the upper stage; and
    a second electrode disposed on the first compound semiconductor active layer at opposite sides of the second compound semiconductor active layer, self-aligned with the second compound semiconductor active layer.

2. The semiconductor device of claim 1 which is a heterojunction bipolar transistor including a base layer comprising the first compound semiconductor active layer, an emitter layer comprising the second compound semiconductor active layer, and a collector layer comprising a compound semiconductor layer disposed between the first compound semiconductor active layer and the compound semiconductor substrate.

3. The semiconductor device of claim 1 wherein the lower stage of the first electrode and the upper stage of the first electrode comprise metals having different etching rates.

4. The semiconductor device of claim 1 wherein the lower stage of the first electrode comprises WSi and the upper stage of the first electrode comprises W, respectively.

5. The semiconductor device of claim 2 wherein the base layer is GaAs, the collector layer is GaAs, and the emitter layer is InGaAs.

* * * * *